United States Patent [19]

Ando

[11] Patent Number: 5,548,139
[45] Date of Patent: Aug. 20, 1996

[54] SCHOTTKY GATE FIELD EFFECT TRANSISTOR

[75] Inventor: Yuji Ando, Tokyo, Japan

[73] Assignee: NEC Corporation, Tokyo, Japan

[21] Appl. No.: 266,616

[22] Filed: Jun. 28, 1994

[30] Foreign Application Priority Data

Jun. 28, 1993 [JP] Japan .................................. 5-155958

[51] Int. Cl.⁶ .................. H01L 31/0328; H01L 31/0336; H01L 29/80
[52] U.S. Cl. ........................... 257/192; 257/194; 257/284
[58] Field of Search ..................................... 257/192, 194, 257/280, 281, 284, 20, 29

[56] References Cited

U.S. PATENT DOCUMENTS 5,343,057  8/1994  Gerard et al. ......................... 257/192

OTHER PUBLICATIONS

By U. Mishra et al., "Microwave Performance of AlInAs–GaInAs HEMT's with 0.2— and 0.1—μm Gate Length", IEEE Electron Device Letters, Dec. 1988, vol. 9, No. 12, pp. 647–649.

Primary Examiner—Wael M. Fahmy
Attorney, Agent, or Firm—Young & Thompson

[57] ABSTRACT

The invention provides a semiconductor multi-layer structure involved in a Schottky gate field effect transistor. The structure comprises a Schottky barrier structure to form a Schottky contact permitting the third conduction band edge to have such a sufficient large discontinuity as to prevent carriers to pass through the Schottky barrier layer, while the Schottky barrier structure includes a quantum well or superlattice structure to permit carriers to exhibit a tunneling at a high probability between the quantum well layer and a cap layer doped at a sufficient high impurity concentration for permitting the fourth compound semiconductor to be in a degenerate state.

39 Claims, 8 Drawing Sheets

5,548,139

SCHOTTKY GATE FIELD EFFECT TRANSISTOR

BACKGROUND OF THE INVENTION

1. Field of the Invention

The invention relates to a semiconductor device, and more particularly to a high frequency and high speed Schottky gate field effect transistor.

2. Description of the Related Art

Improvements and developments of high frequency and high speed field effect transistors made of compound semiconductors such as InP, InGaAs or other compound semiconductors are very important. High electron mobility field effect transistor showing high frequency and high speed performances have a Schottky gate contact, one of which is disclosed in IEEE Electron Device Letters vol. 9, pp-647, 1988. Namely, a gate electrode made of a metal has to be provided directly on a semiconductor layer so that the gate electrode is electrically separated from the semiconductor layers through the Schottky barrier. As well known, a semiconductor-metal contact or Schottky contact provides a conduction band discontinuity which serves as a potential barrier or Schottky barrier which prevents electrons acting as carriers to flow across the Schottky contact from the metal toward the semiconductor. A sufficient height of the Schottky barrier is necessary to suppress a gate leakage current or to suppress electrons to flow across the Schottky contact from the metal toward the semiconductor.

Typical one of conventional Schottky gate field effect transistor will be described with reference to FIG. 1.

The conventional Schottky gate field effect transistor has a semi-insulating InP substrate 90. A non-doped InAlAs buffer layer 91 is formed on the InP substrate 90. A non-doped InGaAs channel layer 92 is formed on the buffer layer 91. A non-doped InAlAs spacer layer 93a is formed on the channel layer 92. An n-doped InAlAs donor layer 93b is formed on the spacer layer 93a. A non-doped InAlAs Schottky barrier layer 93c is formed on the donor layer 93b. An n-doped InGaAs cap layer 94 with a recess is formed on the Schottky barrier layer 93c. The above layers may be grown by molecular beam epitaxy. The recess in the cap layer 94 may be formed by recess etching. Source and drain electrodes 95s and 95d may be formed on the cap layer 94 by evaporation. A Schottky gate electrode 96 may be formed in the recess on the Schottky barrier layer 93c. A two dimensional electron gas is caused in the channel layer 92 at adjacent regions to the interface with the spacer layer in which carriers or electrons are able to move at a high speed in the two dimensional space.

Although the non-doped InAlAs layer is provided to suppress a gate leakage current, a Schottky barrier height is approximately 0.6 eV which seems insufficient to suppress a gate leakage current. Much more high Schottky barrier is required to realize a sufficient suppression of the gate leakage current or to suppress electrons acting as carriers to move across the Schottky contact surface from the metal region of the gate electrode into the semiconductor region.

To combat the above problem as to the gate leakage current, it was proposed to insert a Schottky barrier layer having a larger energy band gap to reduce a gate leakage current. The field effect transistor having a preferable Schottky gate structure with a high potential barrier to reduce a gate leakage current would, however, be engaged with alternative serious problem as described below. Providing the above preferable Schottky barrier structure in the field effect transistor results in the increase of resistance between the cap layer and the channel layer thereby any high frequency and high speed performance is no longer obtainable. Namely, providing the preferable Schottky barrier structure to suppress the gate leakage current results in a reduction of a probability in a tunneling of electrons between the cap layer and the donor layer through the Schootky barrier with a large height and a sufficient thickness necessary for suppressing the gate leakage current.

It would, therefore, be required to develop a novel Scottky gate field effect transistor possessing not only a preferable Schottky barrier structure to suppress any gate leakage current but also a sufficiently reduced resistance between the cap layer and the channel layer to permit the transistor to exhibit a high frequency and high speed performance.

SUMMARY OF THE INVENTION

Accordingly, it is a primary object of the present invention to provide a novel Schottky gate field effect transistor free from any problems as described above.

It is a further object of the present invention to provide a novel Schottky gate field effect transistor possessing a considerably reduced resistance between a channel layer and source or drain electrode.

It is a still further object of the present invention to provide a novel Schottky gate field effect transistor exhibiting a high frequency and high speed performance.

It is a furthermore object of the present invention to provide a novel Schottky gate field effect transistor possessing a preferable Schottky barrier structure to suppress any gate leakage current.

The above and other objects, features and advantages of the present invention will be apparent from the following descriptions.

The present invention may provides a novel field effect transistor with a Schottky barrier structure and either a single quantum well structure and a supper-lattice structure. The novel transistor has a semiconductor substrate, a buffer layer formed on the semiconductor substrate, a channel layer formed on the buffer layer. The transistor also has a carrier supplying layer formed on the channel layer, in which the carrier supplying layer is made of a fifth compound semiconductor doped with a first conductivity type dopant at a dopant concentration. The transistor also has a potential barrier layer formed on the carrier supplying layer in which the potential barrier layer is made of a first compound semiconductor having a first conduction band edge. The transistor also has a quantum well layer formed on the potential barrier layer in which the quantum well layer being made of a second compound semiconductor having a second conduction band edge lower than the first conduction band edge and further lower than a Fermi level in the quantum well. The transistor also has a Schottly barrier layer formed on the quantum well layer in which the Schottky barrier layer is made of a third compound semiconductor having a third conduction band edge being higher than the second conduction band edge. The transistor also has a Schottky gate electrode formed on a first area on the Shottky barrier layer to form a Schottky contact permitting the third conduction band edge to have such a sufficient large discontinuity as to prevent carriers to pass through the Schottky barrier layer. The transistor also has a cap layer formed on a second area separated from the first area on the Schottky barrier layer in which the cap layer is made of a fourth compound semiconductor being doped with the first conductivity type dopant at a sufficient high impurity concentration for permitting the fourth compound semiconductor to be in a degenerate state to permit carriers to exhibit a tunneling at a high probability between the cap layer and the quantum well layer through the Schottky barrier layer and further the cap layer is formed with source and drain electrodes thereon.

For the carrier supplying layer, a thickness and and the dopant concentration are so determined as to permit any one of quantized energy levels of carriers confined in the quantum well layer under the cap layer to align to a Fermi level in no bias state for a resonant tunneling at a high probability between the cap layer and the quantum well layer through the Schottky barrier layer. Preferably, a ground level of carriers confined in the quantum well under the layer aligns to the Fermi level. Majority carriers are electrons and the first conductivity type dopant is an n-type dopant.

Alternatively, the quantum well layer may be replaced by a super lattice structure comprising alternate potential barrier layers and quantum well layers. The potential barrier layer is made of the first compound semiconductor having the first conduction band edge and the quantum well layer is made of a second compound semiconductor having the second conduction band edge being lower than the first conduction band edge and further being lower than a Fermi level in the quantum well under the cap layer, while the second conduction band edge is higher than the Fermi level in the quantum well under the Schottky gate electrode due to a Fermi level pinning.

BRIEF DESCRIPTION OF THE DRAWINGS

Preferred embodiments of the present invention will be described in detail with reference to the accompanying drawings.

DESCRIPTIONS OF THE INVENTION

Figure 1:
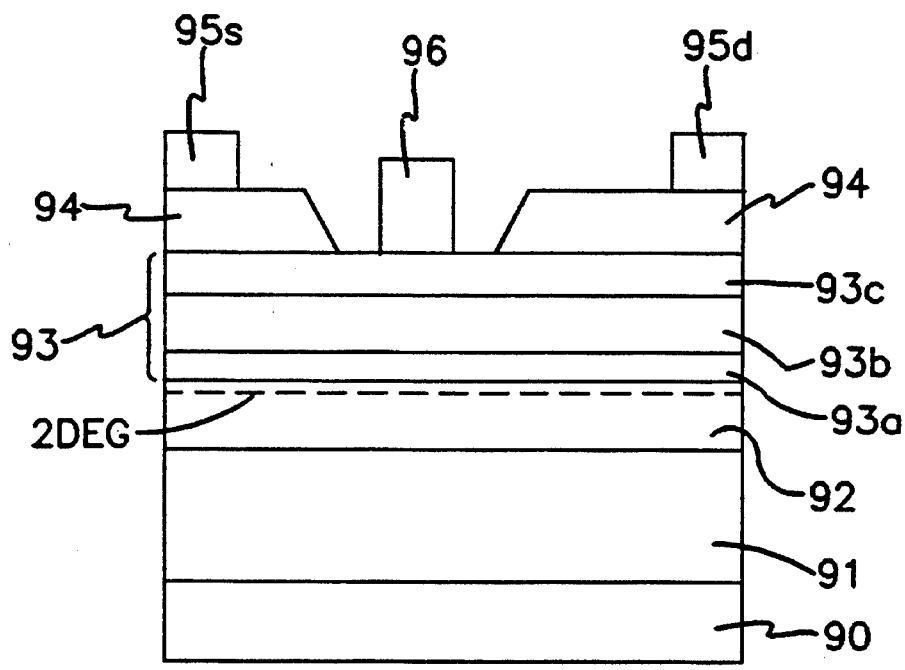
FIG. 1 is a fragmentary cross sectional elevation view illustrative of the conventional Schottky gate field effect transistor.

The present invention may provides a novel field effect transistor with a Schottky barrier structure and either a single quantum well structure and a supper-lattice structure. The novel transistor has a semiconductor substrate, a buffer layer formed on the semiconductor substrate, a channel layer formed on the buffer layer. The transistor also has a carrier supplying layer formed on the channel layer, in which the carrier supplying layer is made of a fifth compound semiconductor doped with a first conductivity type dopant at a dopant concentration. The transistor also has a potential barrier layer formed on the carrier supplying layer in which the potential barrier layer is made of a first compound semiconductor having a first conduction band edge. The transistor also has a quantum well layer formed on the potential barrier layer in which the quantum well layer being made of a second compound semiconductor having a second conduction band edge lower than the first conduction band edge and further lower than a Fermi level in the quantum well. The transistor also has a Schottky barrier layer formed on the quantum well layer in which the Schottky barrier layer is made of a third compound semiconductor having a third conduction band edge being higher than the second conduction band edge. The transistor also has a Schottky gate electrode formed on a first area on the Schottky barrier layer to form a Schottky contact permitting the third conduction band edge to have such a sufficient large discontinuity as to prevent carriers to pass through the Schottky barrier layer. The transistor also has a cap layer formed on a second area separated from the first area on the Schottky barrier layer in which the cap layer is made of a fourth compound semiconductor being doped with the first conductivity type dopant at a sufficient high impurity concentration for permitting the fourth compound semiconductor to be in a degenerate state to permit carriers to exhibit a tunneling at a high probability between the cap layer and the quantum well layer through the Schottky barrier layer and further the cap layer is formed with source and drain electrodes thereon.

For the carrier supplying layer, a thickness and the dopant concentration are so determined as to permit any one of quantized energy levels of carriers confined in the quantum well layer under the cap layer to align to a Fermi level in no bias state for a resonant tunneling at a high probability between the cap layer and the quantum well layer through the Schottky barrier layer. Preferably, a ground level of carriers confined in the quantum well under the layer aligns to the Fermi level. Majority carriers are electrons and the first conductivity type dopant is an n-type dopant.

Alternatively, the quantum well layer may be replaced by a super-lattice structure comprising alternate potential barrier layers and quantum well layers. The potential barrier layer is made of the first compound semiconductor having the first conduction band edge and the quantum well layer is made of a second compound semiconductor having the second conduction band edge being lower than the first conduction band edge and further being lower than a Fermi level in the quantum well under the cap layer, while the second conduction band edge is higher than the Fermi level in the quantum well under the Schottky gate electrode due to a Fermi level pinning.

The above multi-layer structure involved in the novel Schottky gate field effect transistor may provide a preferable Schottky barrier structure under the Schottky gate electrode to prevent electrons to move from the Schottky gate electrode through the Schottky barrier layer. This results in almost no gate leakage current. The above multi-layer structure may also provide a suitable ohmic contact between the cap layer and the channel layer. Namely, the single quantum well structure may permit electrons to exhibit a tunneling between the cap layer and the quantum well layer through the Schottky barrier layer, preferably a resonant tunneling between them at an extremely high probability in which the Fermi level of the degenerated cap layer corresponds to the ground level of electrons confined in the quantum well layer. This permits electrons to move between the cap layer and the quantum well layer with experiencing almost no potential barrier, resulting in a considerable reduction of a resistance between the source or drain electrode and the channel layer. The considerable reductions of the gate leakage current and the resistance between the source or drain electrode and the channel layer may permit the field effect transistor to exhibit a high frequency and high speed performance with a good switching property.

The super-lattice structure may also permit electrons to exhibit a tunneling between the cap layer and the super-lattice through the Schottky barrier layer, preferably a resonant tunneling between them at an extremely high probability in which the Fermi level of the degenerated cap layer corresponds to the ground level of electrons confined in the super-lattice. The permits electrons to move between the cap layer and the quantum well layers involved in the super-lattice structure with experiencing almost no potential barrier, resulting in a considerable reduction of a resistance between the source or drain electrode and the channel layer. The considerable reductions of the gate leakage current and the resistance between the source or drain electrode and the channel layer may also permit the field effect transistor to exhibit a high frequency and high speed performance with a good switching property.

Figure 2:
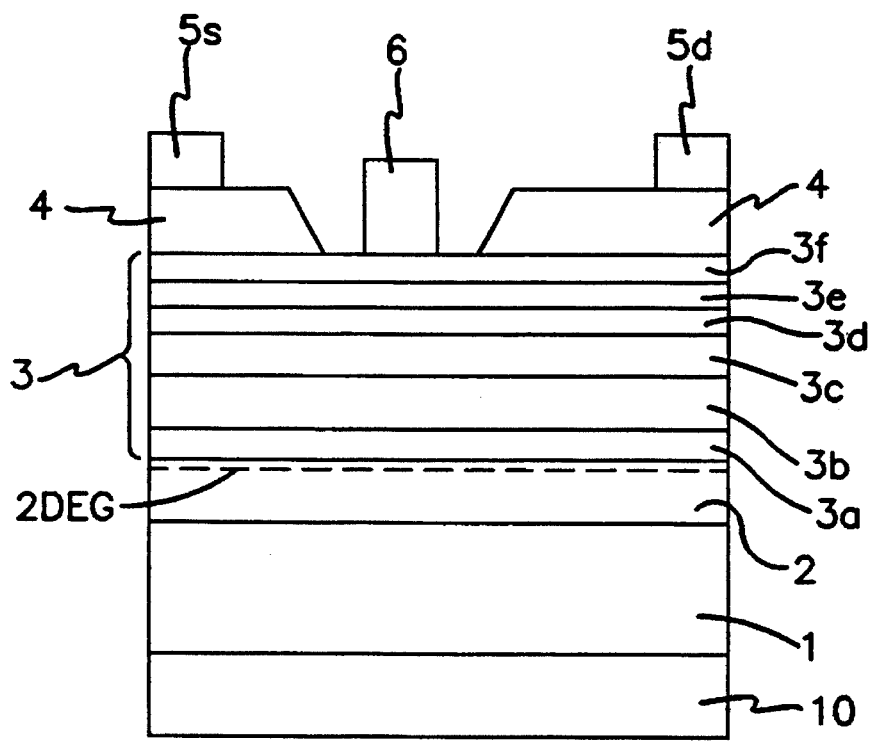
FIG. 2 is a fragmentary cross sectional elevation view illustrative of a novel Schottky gate field effect transistor in a first embodiment according to the present invention.

A first embodiment according to the present invention will be described in detail with reference to FIGS. 2, 3A and 3B in which a novel Schottky gate field effect transistor with a higher Schottky barrier and a lower resistance between source or drain electrode and a channel layer.

The novel field effect transistor in a first embodiment according to the present invention has a semi-insulating InP substrate 10 having a (100) surface. A non-doped $In_{0.52}Al_{0.48}As$ buffer layer 1 having a thickness of 1 micrometer is formed on the semi-insulating InP substrate 10. A non-doped $In_{0.53}Ga_{0.47}As$ channel layer 2 having a thickness of 40 nanometers is formed on the buffer layer 1. A non-doped $In_{0.52}Al_{0.48}As$ spacer layer 3a having a thickness of 2 nanometers is formed on the channel layer 2. An n-doped $In_{0.52}Al_{0.48}As$ donor layer 3b having a dopant concentration of $3\times10^{18}$ cm$^{-3}$ having a thickness of 20 nanometers is formed on the spacer layer 3a. A non-doped $In_{0.52}Al_{0.48}As$ potential barrier layer 3c having a thickness of 10 nanometers is formed on the n-doped donor layer 3b. A non-doped $In_{0.53}Ga_{0.47}As$ quantum well layer 3d having a thickness of 6 nanometers is formed on the potential barrier layer 3c. A non-doped AlAs Schottky barrier layer 3e having a thickness of 2 nanometers is formed on the quantum well layer 3d. The thickness of the Schottky barrier layer 3e is less than a critical thickness of 4 nanometers so that the Schottky barrier layer may play a roll as a strained layer to provide a relaxation of lattice mismatch between the AlAs and InP to suppress any generation of mismatch dislocation in the AlAs Schottky barrier layer 3e. A non-doped $In_{0.52}Al_{0.48}As$ contact layer 3f having a thickness of 2 nanometers is formed on the Schottky barrier layer 3e. An n-doped $In_{0.53}Ga_{0.47}As$ cap layer 4 with a recess portion is formed on the contact layer 3f whose surface is exposed through the recess portion. The cap layer 4 has a thickness of 50 nanometers and such a high dopant concentration of $5\times10^{18}$ cm$^{-3}$ as to permit the InGaAs compound semiconductor thereof to be in a degenerate state. The above layers may be grown by molecular beam epitaxy. The above recess portion may be formed by a selective etching of the cap layer being continued until a surface of the contact layer 3f is exposed through the etched recess portion.

Source and drain electrodes 5s and 5d may selectively be formed by evaporation for subsequent alloy process to form an ohmic contact with the degenerate cap layer 4. A Schottky gate electrode 6 is formed by evaporation using a photoresist pattern prepared by electron beam exposure in the recess portion on the exposed surface of the contact layer 3f. In the novel field effect transistor, the majority carrier is electrons.

Figure 3A:
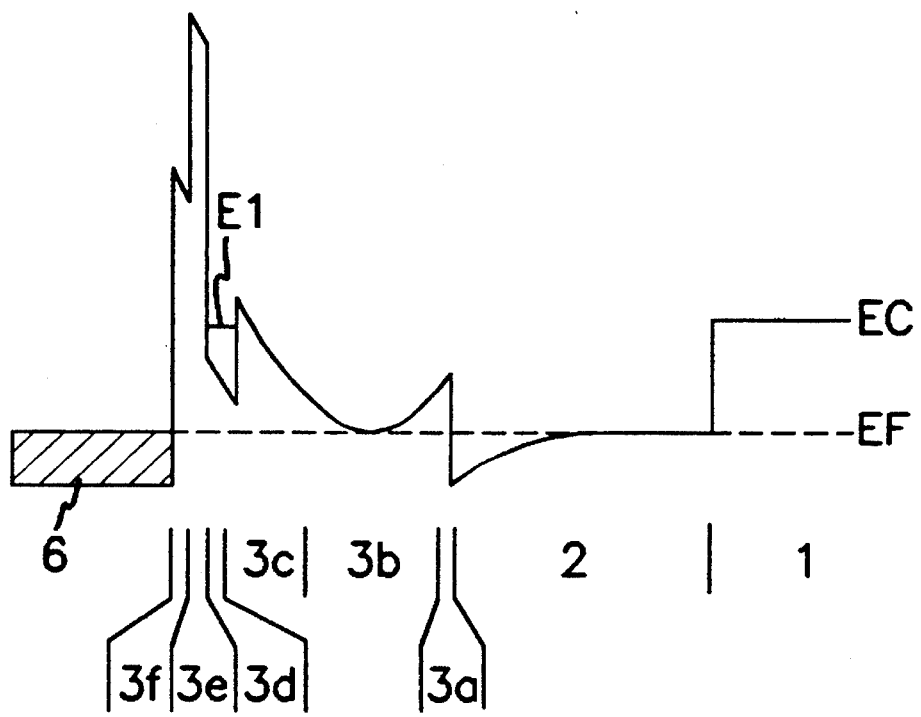
FIG. 3A is a diagram illustrative of conduction band edge profiles under a Schottky gate electrode of a novel field effect transistor in a first embodiment according to the present invention.
Figure 3B:
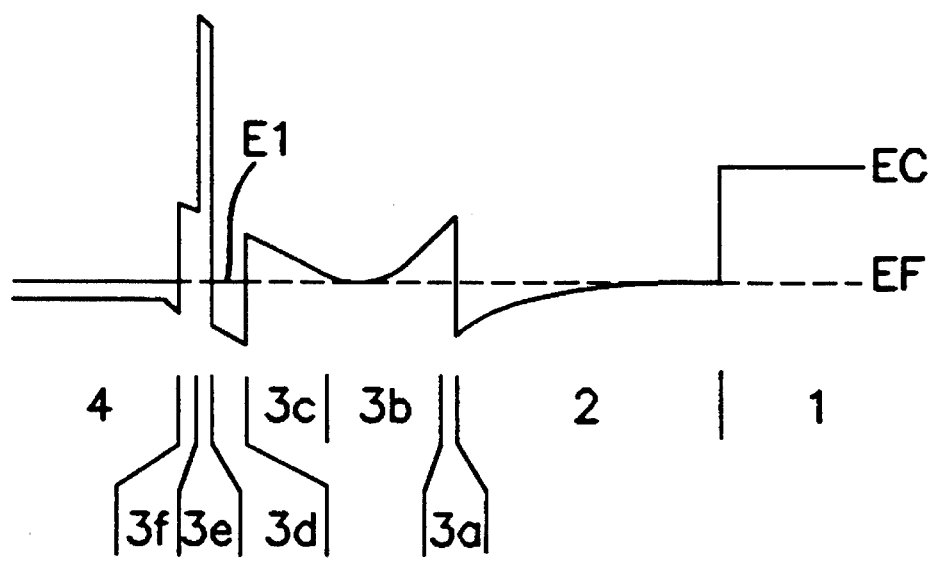
FIG. 3B is a diagram illustrative of conduction band edge profiles under a cap layer of a novel field effect transistor in a first embodiment according to the present invention.

The descriptions will focus on energy band gap profiles of the field effect transistor illustrated in FIGS. 3a and 3b. FIG. 3A illustrates an energy band gap profile of the multi-layer structure including a Schottky barrier structure and a quantum well structure under the Schottky gate electrode, while FIG. 3B illustrates an energy band gap profile of the multi-layer structure including a quantum well structure under the cap layer 4, from which it could readily be appreciated that the conduction band edge profile under the Schottky gate electrode completely differs from the conduction band edge profile under the degenerated cap layer 4 due to the difference in the boundary conditions between the metal-semiconductor contact and the semiconductor heterojunction.

As well known, in thermal equilibrium condition or in the no bias state, the metal-semiconductor contact or the Schottky contact causes a Fermi level pinning in which Fermi levels of each of the layers align to each other thereby the conduction band edge of the semiconductor is greatly raised up to form a large discontinuity at the interface between them. The amount of the discontinuity between the metal-semiconductor and the semiconductors between themselves are defined by semiconductor materials only in contact with each other and namely be free from other boundary conditions. The conduction band edge height of the contact layer is defined by the energy band gap discontinuity provided by the semiconductor material itself. The conduction band edge height of the Schottky barrier layer is defined by the energy band gap discontinuities between the metal gate electrode and the contact layer and between the contact layer and the Schottky barrier layer. The conduction band edge height of the quantum well layer is defined by the energy band gap discontinuity between the Schottky barrier layer and the conduction band edge height of the Schottky barrier layer. It would be very important that the conduction band edge of the quantum well layer lies over the Fermi level in no bias state. The Schottky gate has to be applied with an negative voltage thereby the Schottky interface is biased in reverse direction so that the conduction band edges of the semiconductor layers including the quantum well layer are dropped down, while the conduction band edge of the quantum well layer is slightly dropped since the quantum well layer exists at the adjacent portion to the Schottky interface. Even if the gate electrode receives a positive voltage, the Fermi level of the gate electrode is dropped to the Fermi levels of the semiconductor layers. This results in a more increase of the conduction band edge discontinuity. Thus, the conduction band edge of the quantum well layer always lies over the Fermi level thereof. This may prevent electrons to exhibit any tunneling between the metal gate electrode and the quantum well layer through the potential barrier layer thereby permitting the Schottky barrier layer to suppress any gate leakage current.

The conduction band edge height of the potential barrier layer is defined by the conduction band edge discontinuity between the quantum well layer and itself and the conduction band edge height of the quantum well layer. The donor layer involves a thin charge neutrality region in which the conduction band edge is relatively flat, while the remaining region thereof has a parabola-shaped conduction band edge profile which is smoothly aligned to the conduction band edges of the potential barrier layer and the spacer layer. The channel layer has a two dimensional electron gas relatively adjacent to the interface to the spacer layer. The conduction band edge of the channel layer adjacent to the spacer layer lies under the Fermi level.

A slope of the conduction band edge profiles in the respective layers is caused by an electric field caused by both an electron accumulation on the interface of the Schottky gate electrode and a hole accumulation in the donor layer at an adjacent portion to the potential barrier layer.

FIG. 3B, the conduction band edge profile under the cap layer completely differs from the conduction band edge under the Schottky gate electrode. Fermi levels of each of the semiconductor layers shows the Fermi level pinning when no bias is applied conduction band edge of the cap layer lies under the Fermi level under the thermal equilibrium condition. The conduction band edge profile of the cap layer has a dropped portion adjacent to the interface to the contact layer so that electrons are accumulated in the dropped point. At the interface between the degenerated cap layer and the contact layer, caused is a relatively small conduction band edge discontinuity defined by the semiconductor material of the cap layer and the contact layer. As compared to the conduction band edge profile under the gate electrode, the above conduction band edge discontinuity at the interface between the cap layer and the contact layer is much smaller than the conduction band edge discontinuity at the interface between the gate electrode and the contact layer. The conduction band edge height of the contact layer under the cap layer is lower than the height under the gate electrode. The conduction band edge height of the Schottky barrier layer is defined by the conduction band discontinuity between the contact layer and the Schottky barrier layer. Then, the conduction band edge height of the Schottky barrier layer under the cap layer is smaller than the conduction band edge height of the Schottky barrier layer under the gate electrode. The reduction of the conduction band edge height of the Schottky barrier layer is reduced by an amount almost defined by the difference between the conduction band edge discontinuities at the interfaces to the cap layer and to the gate electrode in which the amount of the conduction band edge discontinuity between the contact layer and the Schottky barrier layer is the same in the regions under the gate electrode and the cap layer. Accordingly, between the conduction band edge profiles under the gate electrode and the cap layer, conduction band edge discontinuities between individual adjacent semiconductor layers are the same as each other. Therefore, the conduction band edge height of the quantum well layer under the cap layer is dropped drown by an amount almost defined by the difference between the conduction band edge discontinuities at the interfaces to the cap layer and to the gate electrode so that the conduction band edge of the quantum well layer under the cap layer lies under the Fermi level.

It would be very important that in each of the cap layer and the quantum well layer the conduction band edge lies under the Fermi level in which Fermi levels of the every layers aligns to each other or on the same level under the thermal equilibrium condition due to the Fermi level pinning. This permits electrons to exhibit a tunneling between the cap layer and the quantum well layer through the potential barriers provided by the contact layer and the Schottky barrier layer. This permits electrons to move between the cap layer and the quantum well layer with experiencing almost no potential barrier. The cap layer is thus ohmically contacted to the quantum well layer. The conduction band edge of the potential barrier layer under the cap layer is raised up from the conduction band edge of the quantum well layer to lie over the Fermi level. The conduction band edge of the donor layer under the cap layer are smoothly connected to the conduction band edges of the potential barrier layer and the spacer layer. The donor layer involves a charge neutrality region extending in a relatively wide region in which the conduction band edge is relatively flat. The conduction band edge profile of the donor layer also has raised up portions at its opposite ends. In the donor layer, the same amount of positive charges or holes are accumulated in the vicinity of the interface to the potential barrier layer. The accumulated holes in the donor layer on its interface to the potential barrier layer and the accumulated electrons in the cap layer on its interface to the contact layer cause an electric field which causes a slop of the conduction band edge profile of each layer. A degree of the slop of the conduction band edge profile is defined by the intensity of the electric field defined by the amount of the accumulated electrons and holes. The degree of the slop of the conduction band edge profile is then controllable by controlling both the dopant concentration of the donor layer and the thickness thereof. The variation in the degree of the slope of the conduction band edge profile for example by controlling the dopant concentration of the donor layer and the thickness thereof may cause a slight variation of the conduction band edge height. Accordingly, the conduction band edge height of the quantum well layer is slightly controllable by controlling the dopant concentration of the donor layer and the thickness thereof. On the other hand, in the quantum well, there are quantized energy levels for confined electrons therein. It would be preferable to so determine the dopant concentration of the donor layer and the thickness thereof that the ground level in the quantized energy levels for electrons in the quantum well layer aligns to or corresponds to the Fermi level. The difference of the ground level for the confined electrons in the quantum well from the conduction band edge of the quantum well layer is defined by the effective mass of the electrons and the well width. Controlling the dopant concentration and the thickness of the donor layer may control the degree of the slop of the conduction band edge profile. This permits the conduction band edge height and the ground level of the quantum well to be controlled so that the ground level aligns and corresponds to the Fermi level. The alignment between the Fermi level and the ground level of the quantum well may permit electrons to exhibit a resonant tunneling at a high probability between the cap layer and the quantum well layer through the potential barriers provided by the contact layer and the Schottky barrier layer. This results in a considerable reduction of the resistance between the cap layer and the quantum well layer thereby the source or drain electrode and the channel layer are ohmically connected to each other through the quantum well which permit the resonant tunneling of the electrons.

The considerable reductions of the gate leakage current and the resistance between the source or drain electrode and the channel layer may also permit the field effect transistor to exhibit a high frequency and high speed performance with a good switching property.

As to the above, in the quantum well, the difference of the ground level $E_1$ for the electrons from the conduction band edge $E_{CW}$ may be given by the following equation.

$$E_1 - E_{CW} = \pi^2 (h/2\pi)^2 / (2m^* L_w^2) \quad (1)$$

where $\pi$ is the ratio of the circumference of a circle to its diameter, h is the Planck constant, $m^*$ is the effective mass of electrons in the quantum well and $L_W$ is the well thickness. When $m^*=0.041$ $m_0$:$m_0$ is the rest mass of electron and $L_W=6$ nanometers, the ground level for the electron in the quantum well 0.25 eV.

The n-doped cap layer and the n-doped donor layer are require to comply with the charge neutrality condition which may be expressed through the depletion approximation by the following equation.

$$qN_d y^2/(2\epsilon) + qN_d y(d_i \Delta d)/\epsilon = (\Delta E_c - E_{Fn})/q \quad (2)$$

where y is the width of a space charge region extending from an interface between the cap layer and the donor layer toward the cap layer, q is the charge of electron, $N_d$ is the dopant concentration of the donor layer, $\epsilon$ is the dielectric constant, $d_i$ is the total thickness of non-doped layers sandwiched between the n-doped cap layer and the n-doped donor layer, $\Delta d$ is the thickness of electron accumulation region appearing in the cap layer on its interface to the contact layer, $\Delta E_C$ is the conduction band edge discontinuity between the cap layer and the contact layer and $E_{Fn}$ is the Fermi level from the conduction band edge. When $N_d=3\times 10^{18}$ cm$^{-3}$, $\epsilon=12.4$ $\epsilon_0$:$\epsilon_0$ is the vacuum dielectric constant, $d_i=20$ nanometers, $\Delta E_C=0.51$ eV and $E_{Fn}=0.04$ eV, $\Delta d$ may be regarded as much smaller than $d_i$ thereby y is estimated to 4.8 nanometers.

According to the depletion approximation, the difference of the conduction band edge from the Fermi level is given by the following equation.

$$(E_{CW} - E_F)/q = qN_d y^2/(2\epsilon) + qN_d y d_1/\epsilon - \Delta E_{CW}/q \quad (3)$$

where $d_1$ is the thickness of the potential barrier layer, $\Delta E_{WC}$ is the conduction band edge discontinuity between the donor layer and the potential barrier layer. When $d_1=10$ nanometers, y=4.8 nanometers and $\Delta E_{CW}=0.51$ eV, $E_{CW}-E_F=-0.25$ eV.

From the above results, it was confirmed that the ground level for electrons in the quantum well lies over the conduction band edge therein by 0.25 eV as well as the Fermi level also lies over the conduction band edge of the quantum well by 0.25 eV. This proves that the Fermi level and the ground level correspond to each other thereby permitting the resonant tunneling of electrons.

Figure 4:
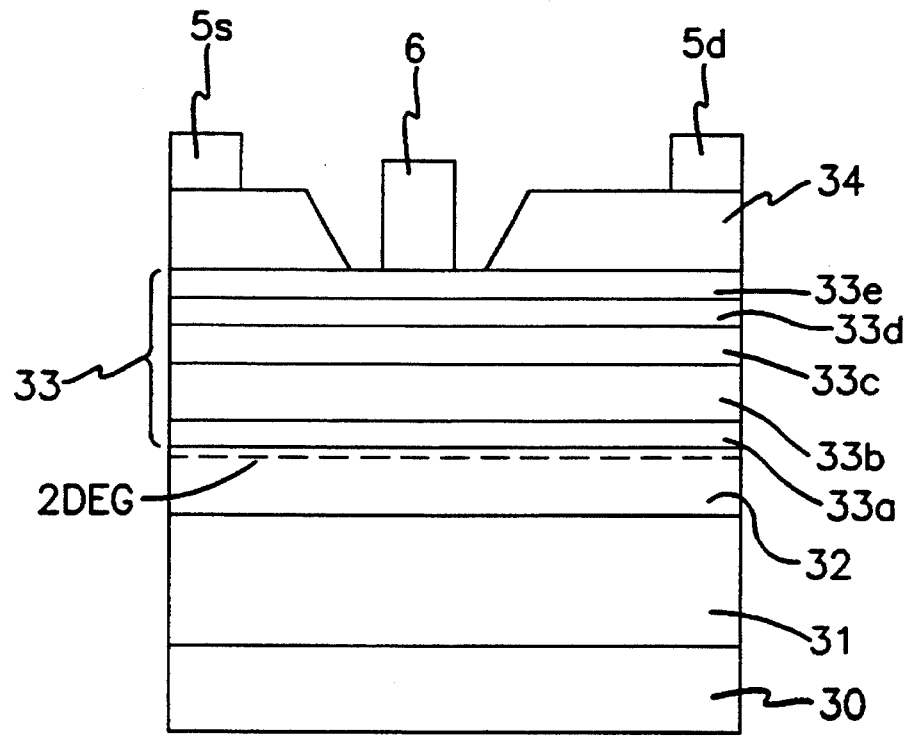
FIG. 4 is a fragmentary cross sectional elevation view illustrative of a novel Schottky gate field effect transistor in a second embodiment according to the present invention.

A second embodiment according to the present invention will be described in detail with reference to FIGS. 4, 5A and 5B in which a novel Schottky gate field effect transistor with a higher Schottky barrier and a lower resistance between source or drain electrode and a channel layer.

The novel field effect transistor in a second embodiment according to the present invention has a semi-insulating GaAs substrate 30 having a (100) surface. A non-doped GaAs buffer layer 31 having a thickness of 1 micrometer is formed on the semi-insulating GaAs substrate 30. A non-doped $In_{0.15}Ga_{0.85}As$ channel layer 32 having a thickness of 15 nanometers is formed on the buffer layer 31. A non-doped $Al_{0.25}Ga_{0.75}As$ spacer layer 33a having a thickness of 2 nanometers is formed on the channel layer 32. An n-doped $Al_{0.25}Ga_{0.75}As$ donor layer 33b having a dopant concentration of $3\times 10^{18}$ cm$^{-3}$ having a thickness of 20 nanometers is formed on the spacer layer 33a. A non-doped $Al_{0.25}Ga_{0.75}As$ potential barrier layer 33c having a thickness of 10 nanometers is formed on the n-doped donor layer 33b. A non-doped GaAs quantum well layer 33d having a thickness of 6 nanometers is formed on the potential barrier layer 33c. A non-doped AlAs Schottky barrier layer 33e having a thickness of 2 nanometers is formed on the quantum well layer 33d. The thickness of the Schottky barrier layer 33e is less than a critical thickness of 4 nanometers so that the Schottky barrier layer may play a roll as a strained layer to provide a relaxation of lattice mismatch between the AlAs and GaAs to suppress any generation of mismatch dislocation in the AlAs Schottky barrier layer 33e. An n-doped GaAs cap layer 34 with a recess portion is formed on the Schottky barrier layer 33e whose surface is exposed through the recess portion. The cap layer 34 has a thickness of 50 nanometers and such a high dopant concentration of $4\times 10^{18}$ cm$^{-3}$ as to permit the GaAs compound semiconductor thereof to be in a degenerate state. The above layers may be grown by molecular beam epitaxy. The above recess portion may be formed by a selective etching of the cap layer being continued until a surface of the Schottky barrier layer is exposed through the etched recess portion.

Source and drain electrodes 5s and 5d may selectively be formed by evaporation for subsequent alloy process to form an ohmic contact with the degenerate cap layer 34. A Schottky gate electrode 6 is formed by evaporation using a photo-resist pattern prepared by electron beam exposure in the recess portion on the exposed surface of the Schottky barrier layer. In the novel field effect transistor, the majority carrier is electrons.

Figure 5A:
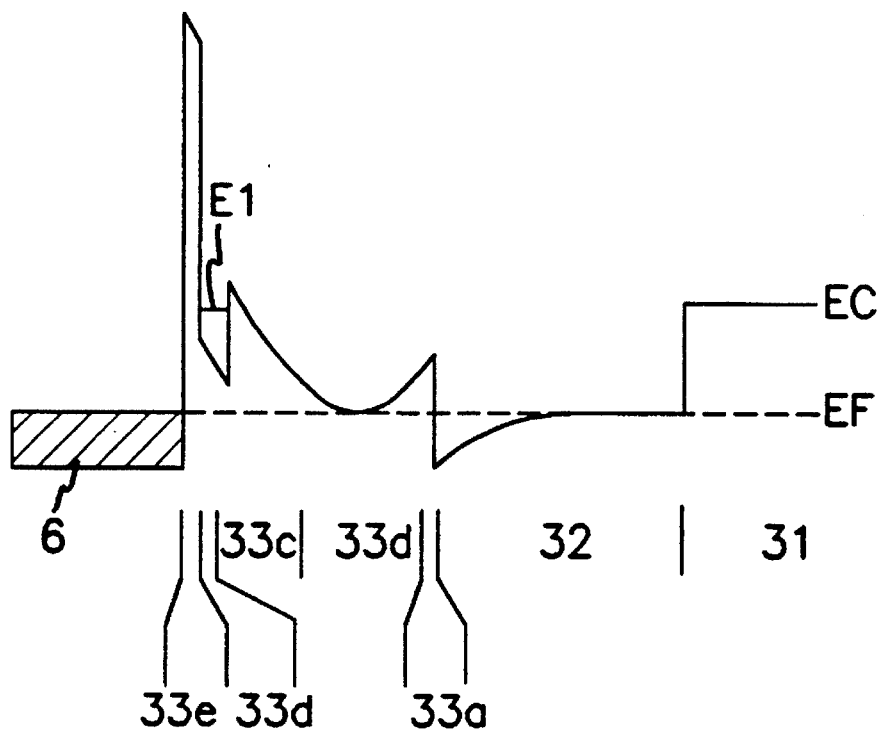
FIG. 5A is a diagram illustrative of conduction band edge profiles under a Schottky gate electrode of a novel field effect transistor in a second embodiment according to the present invention.
Figure 5B:
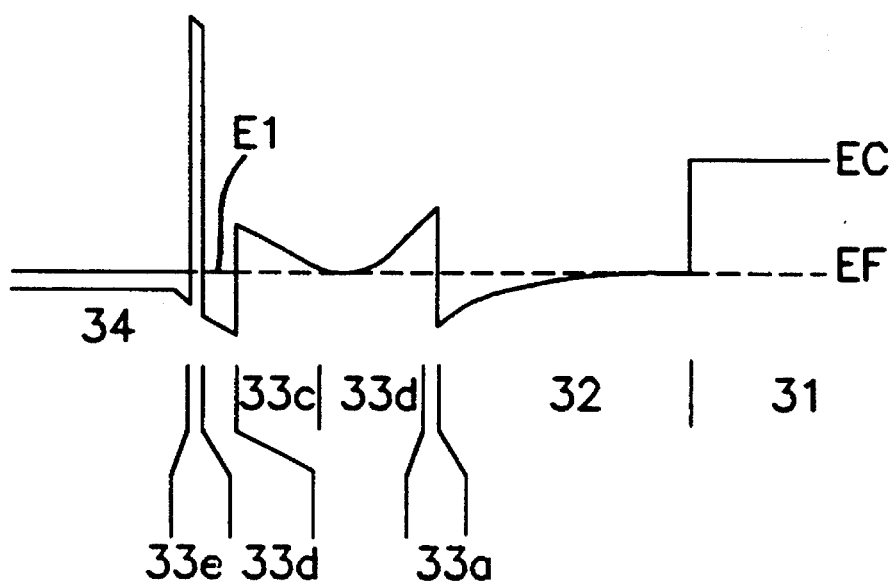
FIG. 5B is a diagram illustrative of conduction band edge profiles under a cap layer of a novel field effect transistor in a second embodiment according to the present invention.

The descriptions will focus on energy band gap profiles of the field effect transistor illustrated in FIGS. 5a and 5b. FIG. 5A illustrates an energy band gap profile of the multi-layer structure including a Schottky barrier structure and a quantum well structure under the Schottky gate electrode, while FIG. 5B illustrates an energy band gap profile of the multi-layer structure including a quantum well structure under the cap layer 34, from which it could readily be appreciated that the conduction band edge profile under the Schottky gate electrode completely differs from the conduction band edge profile under the degenerated cap layer 34 due to the difference in the boundary conditions between the metal-semiconductor contact and the semiconductor heterojunction.

As well known, in thermal equilibrium condition or in the no bias state, the metal-semiconductor contact or the Schottky contact causes a Fermi level pinning in which Fermi levels of each of the layers align to each other thereby the conduction band edge of the semiconductor is greatly raised up to form a large discontinuity at the interface between them. The amount of the discontinuity between the metal-semiconductor and the semiconductors between themselves are defined by semiconductor materials only. The conduction band edge height of the Schottky barrier layer is defined by the energy band gap discontinuity provided by the semiconductor material itself. The conduction band edge height of the quantum well layer is defined by the energy band gap discontinuity between the Schottky barrier layer and the conduction band edge height of the Schottky barrier layer. It would be very important that the conduction band edge of the quantum well layer lies over the Fermi level in no bias state. The Schottky gate has to be applied with an negative voltage thereby the Schottky interface is biased in reverse direction so that the conduction band edges of the semiconductor layers including the quantum well layer are dropped down, while the conduction band edge of the quantum well layer is slightly dropped since the quantum well layer exists at the adjacent portion to the Schottky interface. Even if the gate electrode receives a positive voltage, the Fermi level of the gate electrode is dropped to the Fermi levels of the semiconductor layers. This results in a more increase of the conduction band edge discontinuity. Thus, the conduction band edge of the quantum well layer always lies over the Fermi level thereof. This may prevent electrons to exhibit any tunneling between the metal gate electrode and the quantum well layer through the potential barrier layer thereby permitting the Schottky barrier layer to suppress any gate leakage current.

In FIG. 5B, in each of the cap layer and the quantum well layer the conduction band edge always lies under the Fermi level in which Fermi levels of the every layers aligns to each other or on the same level under the thermal equilibrium condition due to the Fermi level pinning. This permits electrons to exhibit a tunneling between the cap layer and the quantum well layer through the potential barriers provided by the Schottky barrier layer. This permits electrons to move between the cap layer and the quantum well layer with experiencing almost no potential barrier. The cap layer is thus ohmically contacted to the quantum well layer. The conduction band edge of the potential barrier layer under the cap layer is raised up from the conduction band edge of the quantum well layer to lie over the Fermi level. The conduction band edge of the donor layer under the cap layer are smoothly connected to the conduction band edges of the potential barrier layer and the spacer layer. The donor layer involves a charge neutrality region extending in a relatively wide region in which the conduction band edge is relatively flat. The conduction band edge profile of the donor layer also has raised up portions at its opposite ends. In the donor layer, the same amount of positive charges or holes are accumulated in the vicinity of the interface to the potential barrier layer. The accumulated holes in the donor layer on its interface to the potential barrier layer and the accumulated electrons in the cap layer on its interface to the Schottky barrier layer cause an electric field which causes a slop of the conduction band edge profile of each layer. A degree of the slop of the conduction band edge profile is defined by the intensity of the electric field defined by the amount of the accumulated electrons and holes. The degree of the slop of the conduction band edge profile is then controllable by controlling both the dopant concentration of the donor layer and the thickness thereof. The variation in the degree of the slope of the conduction band edge profile for example by controlling the dopant concentration of the donor layer and the thickness thereof may cause a slight variation of the conduction band edge height. Accordingly, the conduction band edge height of the quantum well layer is slightly controllable by controlling the dopant concentration of the donor layer and the thickness thereof. On the other hand, in the quantum well, there are quantized energy levels for confined electrons therein. It would be preferable to so determine the dopant concentration of the donor layer and the thickness thereof that the ground level in the quantized energy levels for electrons in the quantum well layer aligns to or corresponds to the Fermi level. The difference of the ground level for the confined electrons in the quantum well from the conduction band edge of the quantum well layer is defined by the effective mass of the electrons and the well width. Controlling the dopant concentration and the thickness of the donor layer may control the degree of the slop of the conduction band edge profile. This permits the conduction band edge height and the ground level of the quantum well to be controlled so that the ground level aligns and corresponds to the Fermi level. The alignment between the Fermi level and the ground level of the quantum well may permit electrons to exhibit a resonant tunneling at a high probability between the cap layer and the quantum well layer through the potential barriers provided by the Schottky barrier layer. This results in a considerable reduction of the resistance between the cap layer and the quantum well layer thereby the source or drain electrode and the channel layer are ohmically connected to each other through the quantum well which permit the resonant tunneling of the electrons.

The considerable reductions of the gate leakage current and the resistance between the source or drain electrode and the channel layer may also permit the field effect transistor to exhibit a high frequency and high speed performance with a good switching property.

Figure 6:
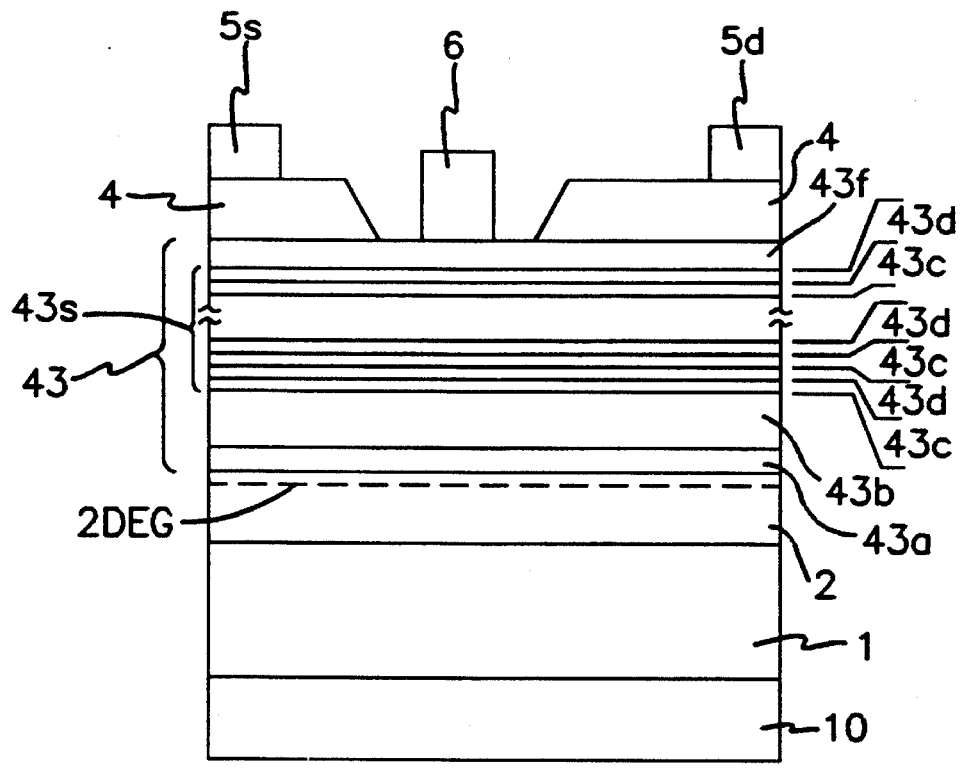
FIG. 6 is a fragmentary cross sectional elevation view illustrative of a novel Schottky gate field effect transistor in a third embodiment according to the present invention.

A third embodiment according to the present invention will be described in detail with reference to FIGS. 6, 7A and 7B in which a novel Schottky gate field effect transistor with a higher Schottky barrier and a lower resistance between source or drain electrode and a channel layer.

The novel field effect transistor in a third embodiment according to the present invention has a semi-insulating InP substrate 10 having a (100) surface. A non-doped $In_{0.42}Ga_{0.48}As$ buffer layer 1 having a thickness of 1 micrometer is formed on the semi-insulating GaAs substrate 10. A non-doped $In_{0.53}Ga_{0.47}As$ channel layer 2 having a thickness of 40 nanometers is formed on the buffer layer 1. A non-doped $In_{0.52}Al_{0.48}As$ spacer layer 43a having a thickness of 2 nanometers is formed on the channel layer 2. An n-doped $In_{0.52}Al_{0.48}As$ donor layer 43b having a dopant concentration of $3\times10^{18}$ cm$^{-3}$ having a thickness of 20 nanometers is formed on the spacer layer 43a. A super-lattice structure 43s is formed on the donor layer 43b. The super-lattice structure comprises three periods of alternate non-doped $Al_{0.8}Ga_{0.2}As$ potential barrier layers 43c having a thickness of 1 nanometer and non-doped $In_{0.6}Ga_{0.4}As$ quantum well layers 43d having a thickness of 5.5 nanometers. A non-doped $In_{0.52}Al_{0.48}As$ contact layer 43f having a thickness of 1 nanometer is formed on the super-lattice structure 43s. An n-doped $In_{0.53}Ga_{0.47}As$ cap layer 4 with a recess portion is formed on the contact layer 43f whose surface is exposed through the recess portion. The cap layer 4 has a thickness of 50 nanometers and such a high dopant concentration of $5 \times 10^{18}$ cm$^{-3}$ as to permit the InGaAs compound semiconductor thereof to be in a degenerate state. The above layers may be grown by molecular beam epitaxy. The above recess portion may be formed by a selective etching of the cap layer being continued until a surface of the contact layer 43f is exposed through the etched recess portion.

Source and drain electrodes 5s and 5d may selectively be formed by evaporation for subsequent alloy process to form an ohmic contact with the degenerate cap layer 4. A Schottky gate electrode 6 is formed by evaporation using a photoresist pattern prepared by electron beam exposure in the recess portion on the exposed surface of the contact layer 43f. In the novel field effect transistor, the majority carrier is electrons.

Figure 7A:
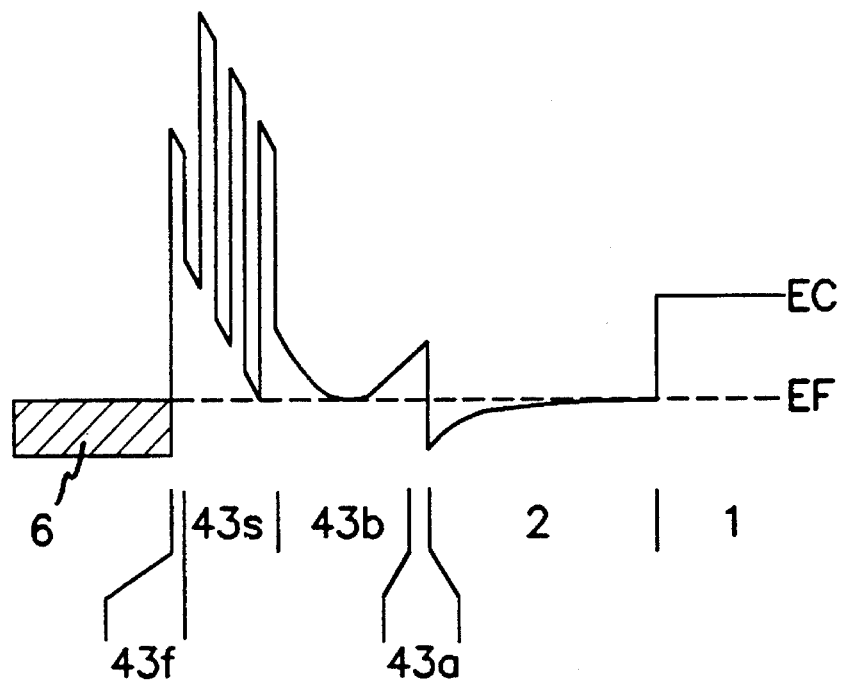
FIG. 7A is a diagram illustrative of conduction band edge profiles under a Schottky gate electrode of a novel field effect transistor in a third embodiment according to the present invention.
Figure 7B:
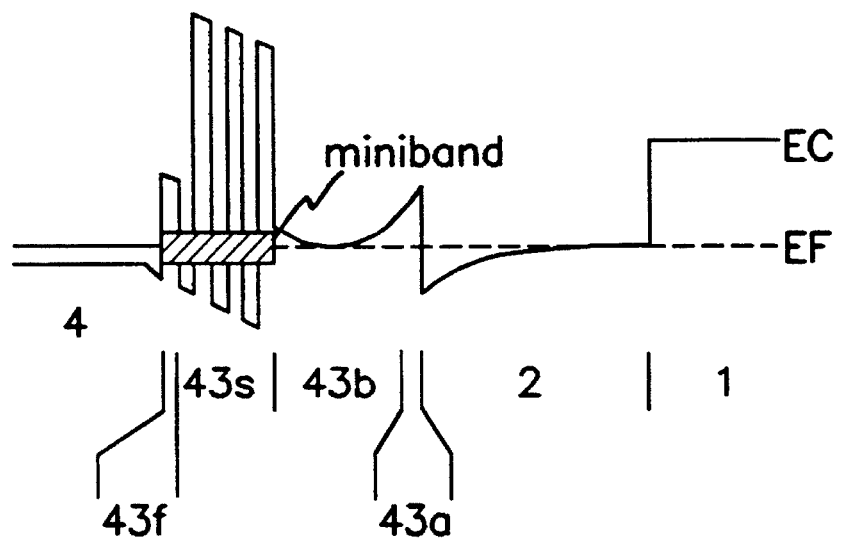
FIG. 7B is a diagram illustrative of conduction band edge profiles under a cap layer of a novel field effect transistor in a third embodiment according to the present invention.

The descriptions will focus on energy band gap profiles of the field effect transistor illustrated in FIGS. 7a and 7b. FIG. 7A illustrates an energy band gap profile of the multi-layer structure including a Schottky barrier structure and a super-lattice structure under the Schottky gate electrode, while FIG. 7B illustrates an energy band gap profile of the multi-layer structure including a super-lattice structure under the cap layer 4, from which it could readily be appreciated that the conduction band edge profile under the Schottky gate electrode completely differs from the conduction band edge profile under the degenerated cap layer 4 due to the difference in the boundary conditions between the metal-semiconductor contact and the semiconductor heterojunction.

As well known, in thermal equilibrium condition or in the no bias state, the metal-semiconductor contact or the Schottky contact causes a Fermi level pinning in which Fermi levels of each of the layers align to each other thereby the conduction band edge of the super-lattice structure is greatly raised up to form a large discontinuity at the interface between them. The conduction band edge of every quantum wells involved in the super-lattice structure always lies over the Fermi level. The Schottky gate has to be applied with an negative voltage thereby the Schottky interface is biased in reverse direction so that the conduction band edges of the super-lattice structure are slightly dropped down as existing at the adjacent portion to the Schottky interface. This may prevent electrons to exhibit any tunneling between the metal gate electrode and the quantum wells through the potential barriers involved in the super-lattice structure thereby permitting the Schottky barrier layer to suppress any gate leakage current.

In FIG. 7B, the conduction band edge profile under the cap layer completely differs from the conduction band edge under the Schottky gate electrode. For the cap layer and the quantum well layers, the conduction band edges lie under the Fermi level in which Fermi levels of the every layers aligns to each other or on the same level under the thermal equilibrium condition due to the Fermi level pinning. This permits electrons to exhibit a tunneling between the cap layer and the quantum well layer through the potential barriers. This permits electrons to move between the cap layer and the quantum well layer with experiencing almost no potential barrier. The cap layer is thus ohmically contacted to the quantum wells involved in the super-lattice structure. The conduction band edge of the potential barriers in the super-lattice structure under the cap layer is raised up from the conduction band edge of the quantum well layers to lie over the Fermi level. The conduction band edge of the donor layer under the cap layer are smoothly connected to the conduction band edges of the potential barrier layer and the spacer layer. The donor layer involves a charge neutrality region extending in a relatively wide region in which the conduction band edge is relatively flat. The conduction band edge profile of the donor layer also has raised up portions at its opposite ends. In the donor layer, the same amount of positive charges or holes are accumulated in the vicinity of the interface to the potential barrier layer. The accumulated holes in the donor layer on its interface to the potential barrier layer and the accumulated electrons in the cap layer on its interface to the contact layer cause an electric field which causes a slop of the conduction band edge profile of each layer. A degree of the slop of the conduction band edge profile is defined by the intensity of the electric field defined by the amount of the accumulated electrons and holes. The degree of the slop of the conduction band edge profile is then controllable by controlling both the dopant concentration of the donor layer and the thickness thereof. The variation in the degree of the slope of the conduction band edge profile for example by controlling the dopant concentration of the donor layer and the thickness thereof may cause a slight variation of the conduction band edge height. Accordingly, the conduction band edge height of the quantum well layer is controllable by controlling the dopant concentration of the donor layer and the thickness thereof. On the other hand, in each of the quantum well involved in the super-lattice structure, there are mini-bands separated to each other for confined electrons therein. It would be preferable that the width of the quantum wells is wide, while the width of the potential barrier is narrow to provide large widths to the mini-bands in each of the quantum wells involved in the super-lattice structure. It would also be preferable to so determine the dopant concentration of the donor layer and the thickness thereof that the Fermi level lies in the mini-bands in the quantum wells in the super-lattice structure to permit electrons to exhibit a resonant tunneling at a high probability between the cap layer and the quantum wells through the potential barriers. The wide mini-bands existing in the quantum wells in the super-lattice structure may relax the conditions required to permit for the resonant tunneling of electrons at a high probability. In this embodiment, the Fermi level lies in the ground mini-band to permit for the resonant tunneling of electrons at a high probability. This results in a considerable reduction of the resistance between the cap layer and the quantum wells in the super-lattice thereby the source or drain electrode and the channel layer are ohmically connected to each other through the super-lattice which permits the resonant tunneling of the electrons.

The considerable reductions of the gate leakage current and the resistance between the source or drain electrode and the channel layer may also permit the field effect transistor to exhibit a high frequency and high speed performance with a good switching property.

Figure 8:
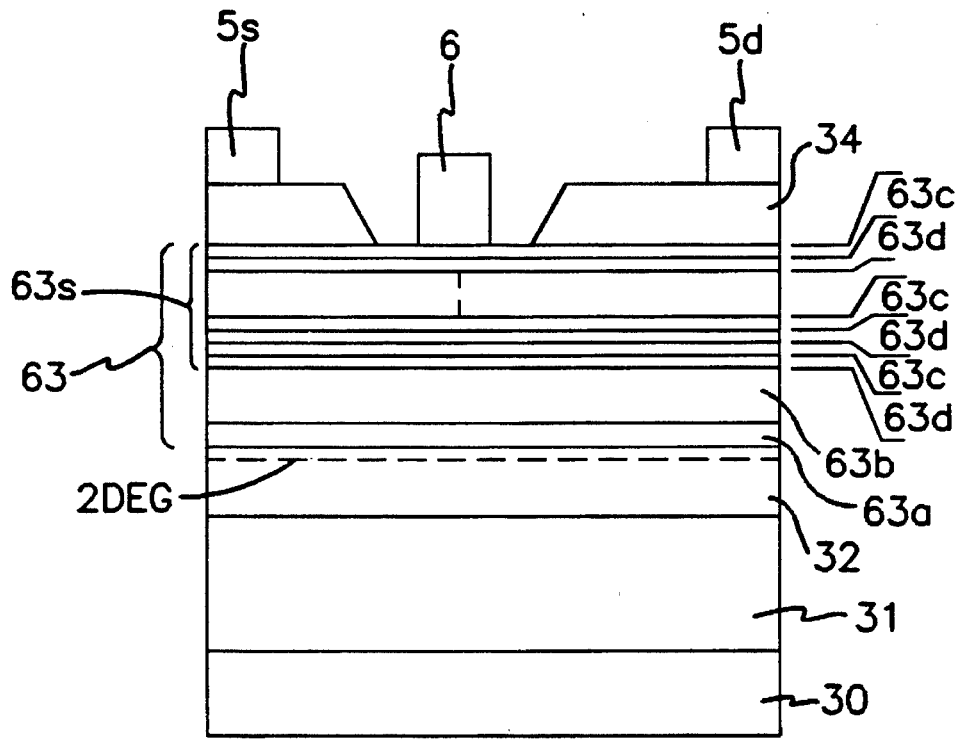
FIG. 8 is a fragmentary cross sectional elevation view illustrative of a novel Schottky gate field effect transistor in a fourth embodiment according to the present invention.

A fourth embodiment according to the present invention will be described in detail with reference to FIGS. 8, 9A and 9B in which a novel Schottky gate field effect transistor with a higher Schottky barrier and a lower resistance between source or drain electrode and a channel layer.

The novel field effect transistor in a fourth embodiment according to the present invention has a semi-insulating GaAs substrate 30 having a (100) surface. A non-doped GaAs buffer layer 31 having a thickness of 1 micrometer is formed on the semi-insulating GaAs substrate 30. A non-doped In$_{0.15}$Ga$_{0.85}$As channel layer 32 having a thickness of 15 nanometers is formed on the buffer layer 31. A non-doped Al$_{0.25}$Ga$_{0.75}$As spacer layer 63a having a thickness of 2 nanometers is formed on the channel layer 62. An n-doped $Al_{0.25}Ga_{0.75}As$ donor layer 63b having a dopant concentration of $3\times10^{18}$ cm$^{-3}$ having a thickness of 20 nanometers is formed on the spacer layer 63a. A super-lattice structure 63s is formed on the donor layer 63b. The super-lattice structure comprises three periods of alternate non-doped $Al_{0.45}Ga_{0.55}As$ potential barrier layers 63c having a thickness of 1 nanometer and non-doped $In_{0.1}Ga_{0.9}As$ quantum well layers 63d having a thickness of 5.5 nanometers. An n-doped GaAs cap layer 34 with a recess portion is formed on a top potential barrier layer 63c involved in the super-lattice structure 43s, whose surface is exposed through the recess portion. The cap layer 34 has a thickness of 40 nanometers and such a high dopant concentration of $4\times10^{18}$ cm$^{-3}$ as to permit the GaAs compound semiconductor thereof to be in a degenerate state. The above layers may be grown by molecular beam epitaxy. The above recess portion may be formed by a selective etching of the cap layer being continued until a surface of the top potential barrier layer 63c is exposed through the etched recess portion.

Source and drain electrodes 5s and 5d may selectively be formed by evaporation for subsequent alloy process to form an ohmic contact with the degenerate cap layer 34. A Schottky gate electrode 6 is formed by evaporation using a photo-resist pattern prepared by electron beam exposure in the recess portion on the exposed surface of the top potential barrier layer involved in the super-lattice 63s. In the novel field effect transistor, the majority carrier is electrons.

Figure 9A:
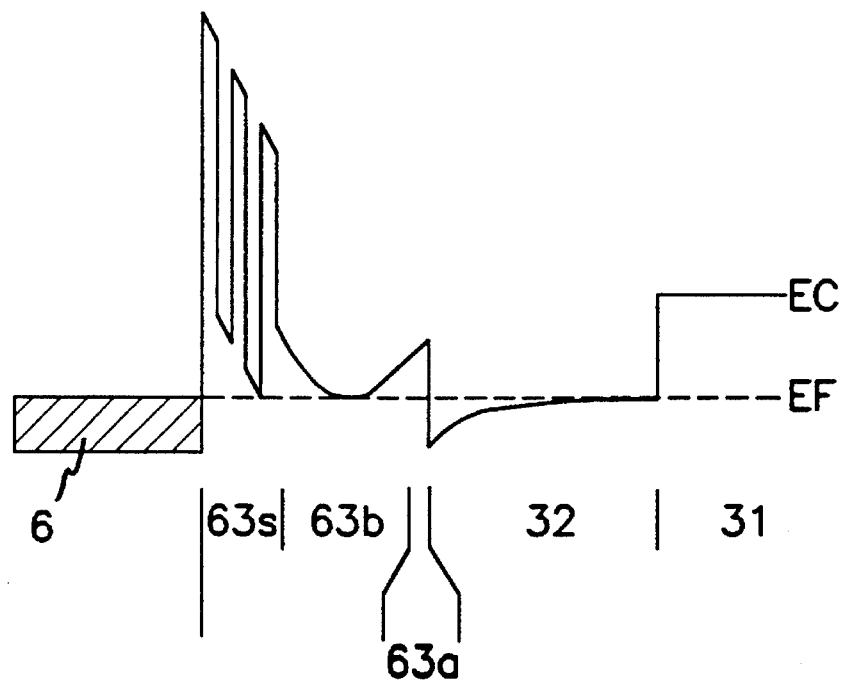
FIG. 9A is a diagram illustrative of conduction band edge profiles under a Schottky gate electrode of a novel field effect transistor in a fourth embodiment according to the present invention.
Figure 9B:
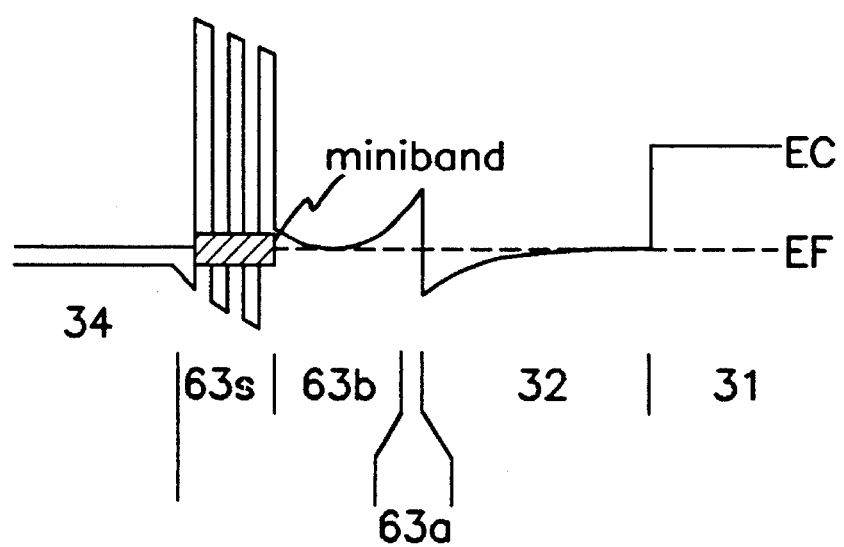
FIG. 9B is a diagram illustrative of conduction band edge profiles under a cap layer of a novel field effect transistor in a fourth embodiment according to the present invention.

The descriptions will focus on energy band gap profiles of the field effect transistor illustrated in FIGS. 9A and 9B. FIG. 9A illustrates an energy band gap profile of the multi-layer structure including a Schottky barrier structure and a super-lattice structure under the Schottky gate electrode, while FIG. 9B illustrates an energy band gap profile of the multi-layer structure including a super-lattice structure under the cap layer 34, from which it could readily be appreciated that the conduction band edge profile under the Schottky gate electrode completely differs from the conduction band edge profile under the degenerated cap layer 4 due to the difference in the boundary conditions between the metal-semiconductor contact and the semiconductor heterojunction.

As well known, in thermal equilibrium condition or in the no bias state, the metal-semiconductor contact or the Schottky contact causes a Fermi level pinning in which Fermi levels of each of the layers align to each other thereby the conduction band edge of the super-lattice structure is greatly raised up to form a large discontinuity at the interface between them. The conduction band edge of every quantum wells involved in the super-lattice structure always lies over the Fermi level. The Schottky gate has to be applied with an negative voltage thereby the Schottky interface is biased in reverse direction so that the conduction band edges of the super-lattice structure are slightly dropped down as existing at the adjacent portion to the Schottky interface. This may prevent electrons to exhibit any tunneling between the metal gate electrode and the quantum wells through the potential barriers involved in the super-lattice structure thereby permitting the Schottky barrier layer to suppress any gate leakage current.

In FIG. 9B, the conduction band edge profile under the cap layer completely differs from the conduction band edge under the Schottky gate electrode. For the cap layer and the quantum well layers, the conduction band edges lie under the Fermi level in which Fermi levels of the every layers aligns to each other or on the same level under the thermal equilibrium condition due to the Fermi level pinning. This permits electrons to exhibit a tunneling between the cap layer and the quantum well layer through the potential barriers involve in the super-lattice. This permits electrons to move between the cap layer and the quantum well layer with experiencing almost no potential barrier. The cap layer is thus ohmically contacted to the quantum wells involved in the super-lattice structure. The conduction band edge of the potential barriers in the super-lattice structure under the cap layer is raised up from the conduction band edge of the quantum well layers to lie over the Fermi level. The conduction band edge of the donor layer under the cap layer are smoothly connected to the conduction band edges of the potential barrier layer and the spacer layer. The donor layer involves a charge neutrality region extending in a relatively wide region in which the conduction band edge is relatively flat. The conduction band edge profile of the donor layer also has raised up portions at its opposite ends. In the donor layer, the same amount of positive charges or holes are accumulated in the vicinity of the interface to the potential barrier layer. The accumulated holes in the donor layer on its interface to the potential barrier layer and the accumulated electrons in the cap layer on its interface to the top potential barrier layer involved in the super-lattice cause an electric field which causes a slop of the conduction band edge profile of each layer. A degree of the slop of the conduction band edge profile is defined by the intensity of the electric field defined by the amount of the accumulated electrons and holes. The degree of the slop of the conduction band edge profile is then controllable by controlling both the dopant concentration of the donor layer and the thickness thereof. The variation in the degree of the slope of the conduction band edge profile for example by controlling the dopant concentration of the donor layer and the thickness thereof may cause a slight variation of the conduction band edge height. Accordingly, the conduction band edge height of the quantum well layer is controllable by controlling the dopant concentration of the donor layer and the thickness thereof. On the other hand, in each of the quantum well involved in the super-lattice structure, there are mini-bands separated to each other for confined electrons therein. It would be preferable that the width of the quantum wells is wide, while the width of the potential barrier is narrow to provide large widths to the mini-bands in each of the quantum wells involved in the super-lattice structure. It would also be preferable to so determine the dopant concentration of the donor layer and the thickness thereof that the Fermi level lies in the mini-bands in the quantum wells in the super-lattice structure to permit electrons to exhibit a resonant tunneling at a high probability between the cap layer and the quantum wells through the potential barriers. The wide mini-bands existing in the quantum wells in the super-lattice structure may relax the conditions required to permit for the resonant tunneling of electrons at a high probability. In this embodiment, the Fermi level lies in the ground mini-band to permit for the resonant tunneling of electrons at a high probability. This results in a considerable reduction of the resistance between the cap layer and the quantum wells in the super-lattice thereby the source or drain electrode and the channel layer are ohmically connected to each other through the super-lattice which permits the resonant tunneling of the electrons.

The considerable reductions of the gate leakage current and the resistance between the source or drain electrode and the channel layer may also permit the field effect transistor to exhibit a high frequency and high speed performance with a good switching property.

Figure 10:
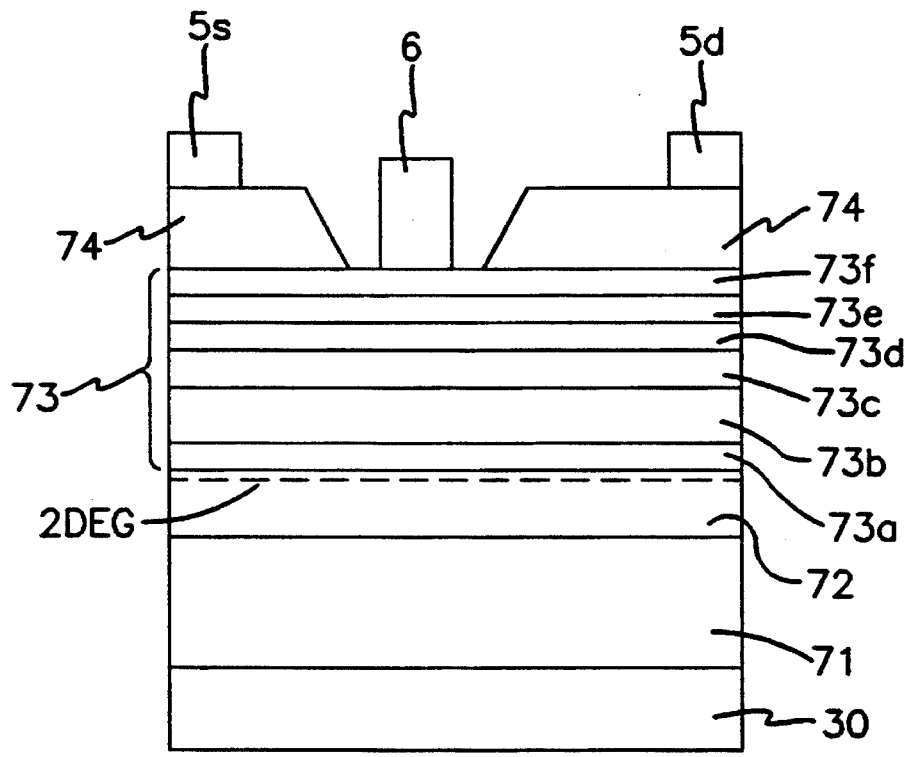
FIG. 10 is a fragmentary cross sectional elevation view illustrative of a novel Schottky gate field effect transistor in a fifth embodiment according to the present invention.

A fifth embodiment according to the present invention will be described in detail with reference to FIG. 10 in which a novel Schottky gate field effect transistor with a higher Schottky barrier and a lower resistance between source or drain electrode and a channel layer.

The novel field effect transistor in a fifth embodiment according to the present invention has a semi-insulating GaAs substrate 30 having a (100) surface. A non-doped AlGaAs buffer layer 71 is formed on the semi-insulating GaAs substrate 30. A non-doped GaAs channel layer 72 is formed on the buffer layer 71. A non-doped AlGaAs spacer layer 73a is formed on the channel layer 72. An n-doped AlGaAs donor layer 73b is formed on the spacer layer 73a. A non-doped AlGaAs potential barrier layer 73c is formed on the n-doped donor layer 73b. A non-doped GaAs quantum well layer 73d is formed on the potential barrier layer 73c. A non-doped AlAs Schottky barrier layer 73e is formed on the quantum well layer 73d. The thickness of the Schottky barrier layer 73e is less than a critical thickness of 4 nanometers. A non-doped AlGaAs contact layer 73f is formed on the Schottky barrier layer 73e. An n-doped GaAs cap layer 74 with a recess portion is formed on the contact layer 73f whose surface is exposed through the recess portion. The cap layer 74 has such a high dopant concentration of $4 \times 10^{18}$ cm$^{-3}$ as to permit the GaAs compound semiconductor thereof to be in a degenerate state. The above layers may be grown by molecular beam epitaxy. The above recess portion may be formed by a selective etching of the cap layer being continued until a surface of the contact layer 73f is exposed through the etched recess portion.

Source and drain electrodes 5s and 5d may selectively be formed by evaporation for subsequent alloy process to form an ohmic contact with the degenerate cap layer 74. A Schottky gate electrode 6 is formed by evaporation using a photo-resist pattern prepared by electron beam exposure in the recess portion on the exposed surface of the contact layer 73f. In the novel field effect transistor, the majority carrier is electrons.

The conduction band edge of the quantum well layer always lies over the Fermi level thereof. This may prevent electrons to exhibit any tunneling between the metal gate electrode and the quantum well layer through the potential barrier layer thereby permitting the Schottky barrier layer to suppress any gate leakage current.

In each of the cap layer and the quantum well layer, the conduction band edge always lies under the Fermi level in which Fermi levels of the every layers aligns to each other or on the same level under the thermal equilibrium condition due to the Fermi level pinning. This permits electrons to exhibit a tunneling between the cap layer and the quantum well layer through the potential barriers provided by the contact layer and the Schottky barrier layer. This permits electrons to move between the cap layer and the quantum well layer with experiencing almost no potential barrier. The cap layer is thus ohmically contacted to the quantum well layer. Controlling the dopant concentration and the thickness of the donor layer may control the degree of the slop of the conduction band edge profile. This permits the conduction band edge height and the ground level of the quantum well to be controlled so that the ground level aligns and corresponds to the Fermi level. The alignment between the Fermi level and the ground level of the quantum well may permit electrons to exhibit a resonant tunneling at a high probability between the cap layer and the quantum well layer through the potential barriers provided by the contact layer and the Schottky barrier layer. This results in a considerable reduction of the resistance between the cap layer and the quantum well layer thereby the source or drain electrode and the channel layer are ohmically connected to each other through the quantum well which permit the resonant tunneling of the electrons.

The considerable reductions of the gate leakage current and the resistance between the source or drain electrode and the channel layer may also permit the field effect transistor to exhibit a high frequency and high speed performance with a good switching property.

Figure 11:
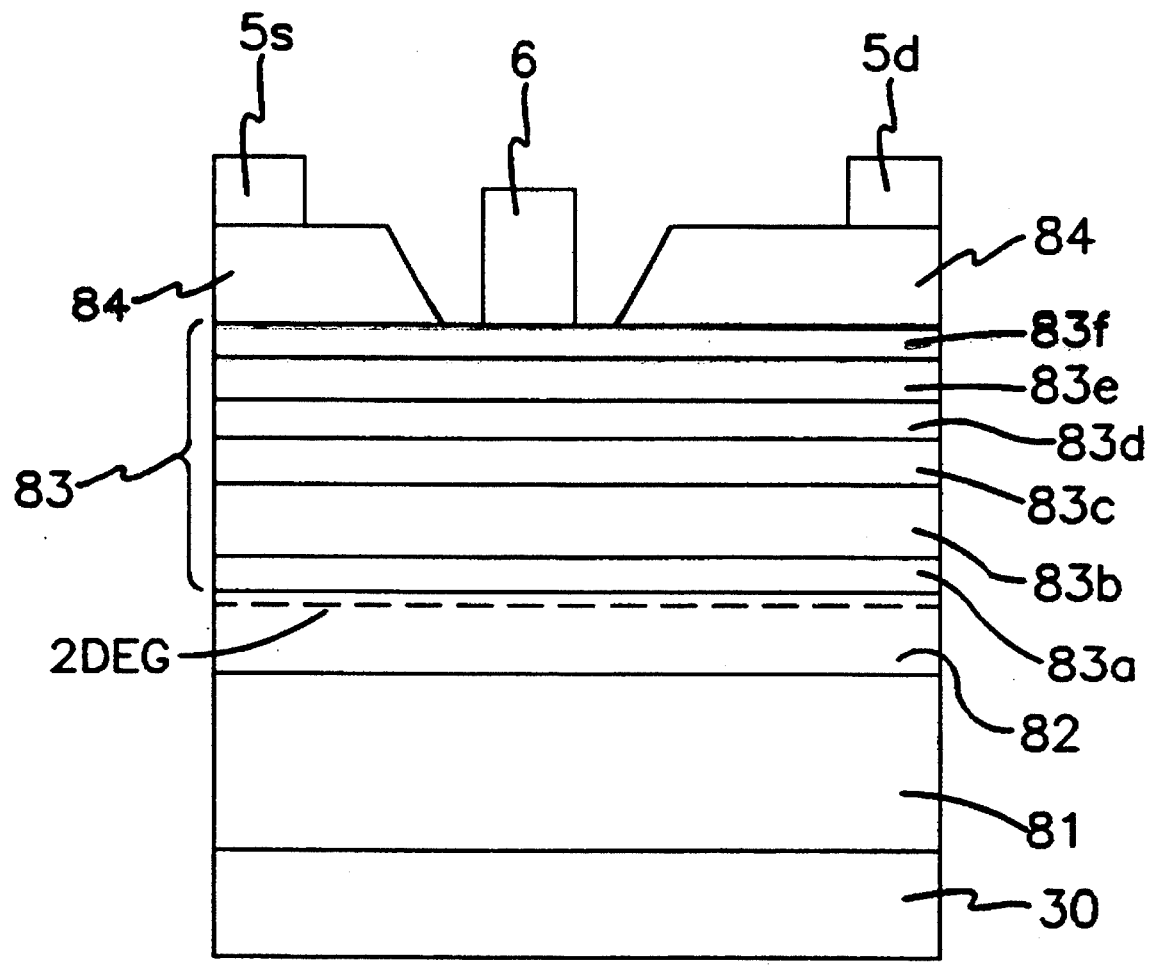
FIG. 11 is a fragmentary cross sectional elevation view illustrative of a novel Schottky gate field effect transistor in a sixth embodiment according to the present invention.

A sixth embodiment according to the present invention will be described in detail with reference to FIG. 11 in which a novel Schottky gate field effect transistor with a higher Schottky barrier and a lower resistance between source or drain electrode and a channel layer.

The novel field effect transistor in a fifth embodiment according to the present invention has a semi-insulating GaAs substrate 30 having a (100) surface. A non-doped AlGaAs buffer layer 81 is formed on the semi-insulating GaAs substrate 30. A non-doped In$_{0.15}$Ga$_{0.85}$As channel layer 82 is formed on the buffer layer 81. A non-doped AlGaAs spacer layer 83a is formed on the channel layer 82. An n-doped AlGaAs donor layer 83b is formed on the spacer layer 83a. A non-doped AlGaAs potential barrier layer 83c is formed on the n-doped donor layer 83b. A non-doped In$_{0.15}$Ga$_{0.85}$As quantum well layer 83d is formed on the potential barrier layer 83c. A thickness of the quantum well layer is less than a critical thickness of 20 nanometers so as to permit the quantum well layer to serve as a strained layer to suppress any misfit dislocation due to a lattice mismatch. A non-doped AlAs Schottky barrier layer 83e is formed on the quantum well layer 83d. The thickness of the Schottky barrier layer 83e is less than a critical thickness of 4 nanometers. A non-doped AlGaAs contact layer 83f is formed on the Schottky barrier layer 83e. An n-doped GaAs cap layer 84 with a recess portion is formed on the contact layer 83f whose surface is exposed through the recess portion. The cap layer 84 has such a high dopant concentration of $4 \times 10^{18}$ cm$^{-3}$ as to permit the GaAs compound semiconductor thereof to be in a degenerate state. The above layers may be grown by molecular beam epitaxy. The above recess portion may be formed by a selective etching of the cap layer being continued until a surface of the contact layer 83f is exposed through the etched recess portion.

Source and drain electrodes 5s and 5d may selectively be formed by evaporation for subsequent alloy process to form an ohmic contact with the degenerate cap layer 84. A Schottky gate electrode 6 is formed by evaporation using a photo-resist pattern prepared by electron beam exposure in the recess portion on the exposed surface of the contact layer 83f. In the novel field effect transistor, the majority carrier is electrons.

The conduction band edge of the quantum well layer always lies over the Fermi level thereof. This may prevent electrons to exhibit any tunneling between the metal gate electrode and the quantum well layer through the potential barrier layer thereby permitting the Schottky barrier layer to suppress any gate leakage current.

In each of the cap layer and the quantum well layer, the conduction band edge always lies under the Fermi level in which Fermi levels of the every layers aligns to each other or on the same level under the thermal equilibrium condition due to the Fermi level pinning. This permits electrons to exhibit a tunneling between the cap layer and the quantum well layer through the potential barriers provided by the contact layer and the Schottky barrier layer. This permits electrons to move between the cap layer and the quantum well layer with experiencing almost no potential barrier. The cap layer is thus ohmically contacted to the quantum well layer. Controlling the dopant concentration and the thickness of the donor layer may control the degree of the slop of the conduction band edge profile. This permits the conduction band edge height and the ground level of the quantum well to be controlled so that the ground level aligns and corresponds to the Fermi level. The alignment between the Fermi level and the ground level of the quantum well may permit electrons to exhibit a resonant tunneling at a high probability between the cap layer and the quantum well layer through the potential barriers provided by the contact layer and the Schottky barrier layer. This results in a considerable reduction of the resistance between the cap layer and the quantum well layer thereby the source or drain electrode and the channel layer are ohmically connected to each other through the quantum well which permit the resonant tunneling of the electrons.

The considerable reductions of the gate leakage current and the resistance between the source or drain electrode and the channel layer may also permit the field effect transistor to exhibit a high frequency and high speed performance with a good switching property.

Whereas modifications of the present invention will no doubt be apparent to a person having ordinary skill in the art to which the invention pertains, it is to be understood that the embodiments shown and described by way of illustrations are by no means intended to be considered in a limiting sense. Accordingly, it is to be intended to cover by the claims all modifications of the invention which fall within the sprit and scope of the invention.

What is claimed is:

1. A semiconductor multi-layer structure comprising:

a superlattice structure comprising alternate potential barrier layers and quantum well layers, said potential barrier layers being made of a first compound semiconductor having a first conduction band edge and said quantum well layers being made of a second compound semiconductor having a second conduction band edge being lower than said first conduction band edge;

a Schottky barrier layer having a first surface in contact with said superlattice structure, said Schottky barrier layer being made of a third compound semiconductor having a third conduction band edge being higher than said second conduction band edge;

a Schottky electrode formed on a first area in a second surface of said Schottky barrier layer to form a Schottky contact permitting said third conduction band edge to have such a sufficient large discontinuity as to prevent carriers from passing through said Schottky barrier layer; and a cap layer formed on a second area separated from said first area in said second surface of said Schottky barrier layer, said cap layer being made of a fourth compound semiconductor being doped with a first conductivity type dopant at a sufficient high impurity concentration for permitting said fourth compound semiconductor to be in a degenerate state to permit tunneling of carriers at a high probability through said Schottky barrier layer and said superlattice structure.

2. The semiconductor multi-layer structure as claimed in claim 1, further comprising a carrier supplying layer being made of a fifth compound semiconductor and being in contact with a first potential barrier layer of said superlattice structure, said carrier supplying layer being doped with said first conductivity type dopant at a dopant concentration.

3. The semiconductor multi-layer structure as claimed in claim 2, wherein for said carrier supplying layer a thickness and said dopant concentration are so determined as to permit any one of quantized energy levels of carriers confined in said quantum well layer under said cap layer to align to a Fermi level, while said conduction band edge of said quantum well layer under said Schottky electrode lies over said Fermi level in a no bias state for a resonant tunneling at a high probability between said cap layer and said quantum well layer through said Schottky barrier layer.

4. The semiconductor multi-layer structure as claimed in claim 3, wherein a ground level of carriers confined in said quantum well layer aligns to said Fermi level.

5. The semiconductor multi-layer structure as claimed in claim 2, wherein majority carriers are electrons and said said first conductivity type dopant is an n-type dopant.

6. The semiconductor multi-layer structure as claimed in claim 1, wherein:

said first compound semiconductor comprises non-doped $Al_{0.8}Ga_{0.2}As$;

said second compound semiconductor comprises non-doped $In_{0.6}Ga_{0.4}As$;

said third compound semiconductor comprises non-doped $In_{0.52}Al_{0.48}As$; and said fourth compound semiconductor comprises $In_{0.53}Ga_{0.47}As$ doped with said n-type dopant at a dopant concentration of $5 \times 10^{18}$ cm$^{-3}$.

7. The semiconductor multi-layer structure as claimed in claim 5, wherein said fifth compound semiconductor comprises $In_{0.52}Ga_{0.48}As$ doped with said n-type dopant at a dopant concentration of $3 \times 10^{18}$ cm$^{-3}$.

8. The semiconductor multi-layer structure as claimed in claim 6, wherein:

said potential barrier layer has a thickness of 1 nanometer;

said quantum well layer has a thickness of 5.5 nanometers; and said Schottky barrier layer has a thickness equal to or less than 1 nanometer.

9. The semiconductor multi-layer structure as claimed in claim 7, wherein said carrier supplying layer has a thickness of 20 nanometers.

10. The semiconductor multi-layer structure as claimed in claim 1, wherein:

said first compound semiconductor comprises non-doped $Al_{0.45}Ga_{0.55}As$;

said second compound semiconductor comprises non-doped $In_{0.1}Ga_{0.9}As$;

said third compound semiconductor comprises non-doped $Al_{0.45}Ga_{0.55}As$; and said fourth compound semiconductor comprises GaAs doped with said n-type dopant at a dopant concentration of $4 \times 10^{18}$ cm$^{-3}$.

11. The semiconductor multi-layer structure as claimed in claim 5, wherein said fifth compound semiconductor comprises $Al_{0.25}Ga_{0.75}As$ doped with said n-type dopant at a dopant concentration of $3 \times 10^{18}$ cm$^{-3}$.

12. The semiconductor multi-layer structure as claimed in claim 10, wherein:

said potential barrier layer has a thickness of 1 nanometer;

said quantum well layer has a thickness of 5.5 nanometers; and said Schottky barrier layer has a thickness equal to or less than 1 nanometer.

13. The semiconductor multi-layer structure as claimed in claim 7, wherein said carrier supplying layer has a thickness of 20 nanometers.

14. The semiconductor multi-layer structure as claimed in claim 1, wherein said superlattice structure has three periods of said alternate potential barrier layers and quantum well layers.

15. A semiconductor field effect transistor comprising:

a semiconductor substrate;

a buffer layer formed on said semiconductor substrate;

a channel layer formed on said buffer layer;

a carrier supplying layer formed on said channel layer, said carrier supplying layer being made of a fifth compound semiconductor doped with a first conductivity type dopant at a dopant concentration;

a potential barrier layer formed on said carrier supplying layer, said potential barrier layer being made of a first compound semiconductor having a first conduction band edge;

a quantum well layer formed on said potential barrier layer, said quantum well layer being made of a second compound semiconductor having a second conduction band edge lower than said first conduction band edge and further;

a Schottky barrier layer formed on said quantum well layer, said Schottky barrier layer being made of a third compound semiconductor having a third conduction band edge higher than said second conduction band edge;

a Schottky electrode formed on a first area on said Schottky barrier layer to form a Schottky contact permitting said third conduction band edge to have such a sufficient large discontinuity as to prevent carriers from passing through said Schottky barrier layer; and a cap layer formed on a second area separated from said first area on said Schottky barrier layer, said cap layer being made of a fourth compound semiconductor doped with said first conductivity type dopant at a sufficient high impurity concentration for permitting said fourth compound semiconductor to be in a degenerate state to permit tunneling of carriers at a high probability between said cap layer and said quantum well layer through said Schottky barrier layer and further said cap layer being formed with source and drain electrodes thereon.

16. The semiconductor field effect transistor as claimed in claim 15, wherein a thickness and said dopant concentration of said carrier supplying layer are so determined as to permit any one of quantized energy levels of carriers confined in said quantum well layer under said cap layer to align to a Fermi level, while said conduction band edge of said quantum well layer under said Schottky electrode lies over said Fermi level in a no bias state for resonant tunneling at a high probability between said cap layer and said quantum well layer through said Schottky barrier layer.

17. The semiconductor field effect transistor as claimed in claim 16, wherein a ground level of carriers confined in said quantum well layer aligns to said Fermi level.

18. The semiconductor field effect transistor as claimed in claim 15, wherein majority carriers are electrons and said first conductivity type dopant is an n-type dopant.

19. The semiconductor field effect transistor as claimed in claim 15, wherein:

said first compound semiconductor comprises non-doped $In_{0.52}Al_{0.48}As$;

said second compound semiconductor comprises non-doped $In_{0.53}Ga_{0.47}As$;

said third compound semiconductor comprises non-doped AlAs;

said fourth compound semiconductor comprises $In_{0.53}Ga_{0.47}As$ doped with said n-type dopant at a dopant concentration of $5\times10^{18}$ cm$^{-3}$; and said fifth compound semiconductor comprises $In_{0.52}Ga_{0.48}As$ doped with said n-type dopant at a dopant concentration of $3\times10^{18}$ cm$^{-3}$.

20. The semiconductor field effect transistor as claimed in claim 19, wherein:

said potential barrier layer has a thickness of 10 nanometers;

said quantum well layer has a thickness of 6 nanometers; and said Schottky barrier layer has a thickness equal to or less than 4 nanometers; and said carrier supplying layer has a thickness of 20 nanometers.

21. The semiconductor field effect transistor as claimed in claim 15, wherein:

said first compound semiconductor comprises non-doped $Al_{0.25}Ga_{0.75}As$;

said second compound semiconductor comprises non-doped GaAs;

said third compound semiconductor comprises non-doped AlAs; and said fourth compound semiconductor comprises GaAs doped with said n-type dopant at a dopant concentration of $4\times10^{18}$ cm$^{-3}$; and said fifth compound semiconductor comprises $Al_{0.25}Ga_{0.75}As$ doped with said n-type dopant at a dopant concentration of $3\times10^{18}$ cm$^{-3}$.

22. The semiconductor field effect transistor as claimed in claim 21, wherein:

said potential barrier layer has a thickness of 10 nanometers;

said quantum well layer has a thickness of 7 nanometers; and said Schottky barrier layer has a thickness equal to or less than 4 nanometers; and said carrier supplying layer has a thickness of 20 nanometers.

23. The semiconductor field effect transistor as claimed in claim 19, wherein said potential barrier layer further includes a contact layer made of non-doped $In_{0.52}Al_{0.48}As$ in contact with said Schottky electrode and said cap layer.

24. The semiconductor field effect transistor as claimed in claim 23, wherein said contact layer has a thickness of 2 nanometers.

25. The semiconductor field effect transistor as claimed in claim 21, wherein said potential barrier layer further includes a contact layer made of non-doped $Al_{0.25}Ga_{0.75}As$ in contact with said Schottky electrode and said cap layer.

26. The semiconductor field effect transistor as claimed in claim 25, wherein said contact layer has a thickness of 2 nanometers.

27. A semiconductor field effect transistor comprising:

a semiconductor substrate;

a buffer layer formed on said semiconductor substrate;

a channel layer formed on said buffer layer;

a carrier supplying layer formed on said channel layer, said carrier supplying layer being made of a fifth compound semiconductor doped with a first conductivity type dopant at a dopant concentration;

a superlattice structure comprising alternate potential barrier layers and quantum well layers, said potential barrier layer being made of a first compound semiconductor having a first conductor band edge and said quantum well layer being made of a second compound semiconductor having a second conduction band edge being lower than said first conduction band edge;

a Schottky barrier layer having a first surface being in contact with said superlattice structure, said Schottky barrier layer being made of a third compound semiconductor having a third conduction band edge being higher than said second conduction band edge;

a Schottky electrode formed on a first area in a second surface of said Schottky barrier layer to form a Schottky contact permitting said third conduction band edge to have such a sufficient large discontinuity as to prevent carriers from passing through said Schottky barrier layer; and a cap layer formed on a second area separated from said first area in said second surface of said Schottky barrier layer, said cap layer being made of a fourth compound semiconductor being doped with a first conductivity type dopant at a sufficient high impurity concentration for permitting said fourth compound semiconductor to be in a degenerate state to permit tunneling of carriers at a high probability through said Schottky barrier layer and said superlattice structure and further said cap layer being formed with source and drain electrodes thereon.

28. The semiconductor field effect transistor as claimed in claim 27, wherein a thickness and said dopant concentration of said carrier supplying layer are so determined as to permit any one of quantized energy levels of carriers confined in said quantum well layer under said cap layer to align to a Fermi level, while said conduction band edge of said quantum well layer under said Schottky electrode lies over said Fermi level in a no bias state for resonant tunneling at a high probability between said cap layer and said quantum well layer through said Schottky barrier layer.

29. The semiconductor field effect transistor as claimed in claim 28, wherein a ground level of carriers confined in said quantum well layer aligns to said Fermi level.

30. The semiconductor field effect transistor as claimed in claim 27, wherein majority carriers are electrons and said first conductivity type dopant is an n-type dopant.

31. The semiconductor field effect transistor as claimed in claim 27, wherein:

said first compound semiconductor comprises non-doped $Al_{0.8}Ga_{0.2}As$;

said second compound semiconductor comprises non-doped $In_{0.6}Ga_{0.4}As$;

said third compound semiconductor comprises non-doped $In_{0.52}Al_{0.48}As$; and said fourth compound semiconductor comprises an $In_{0.53}Ga_{0.47}As$ doped with said n-type dopant at a dopant concentration of $5\times10^{18}$ cm$^{-3}$.

32. The semiconductor field effect transistor as claimed in claim 30, wherein said fifth compound semiconductor comprises $In_{0.52}Ga_{0.48}As$ doped with said n-type dopant at a dopant concentration of $3\times10^{18}$ cm$^{-3}$.

33. The semiconductor field effect transistor as claimed in claim 31, wherein:

said potential barrier layer has a thickness of 1 nanometer;

said quantum well layer has a thickness of 5.5 nanometers; and said Schottky barrier layer has a thickness equal to or less than 1 nanometer.

34. The semiconductor field effect transistor as claimed in claim 32, wherein said carrier supplying layer has a thickness of 20 nanometers.

35. The semiconductor field effect transistor as claimed in claim 27, wherein:

said first compound semiconductor comprises non-doped $Al_{0.45}Ga_{0.55}As$;

said second compound semiconductor comprises non-doped $In_{0.1}Ga_{0.9}As$;

said third compound semiconductor comprises non-doped $Al_{0.45}Ga_{0.55}As$; and said fourth compound semiconductor comprises a GaAs doped with said n-type dopant at a dopant concentration of $4\times10^{18}$ cm$^{-3}$.

36. The semiconductor field effect transistor as claimed in claim 35, wherein said fifth compound semiconductor comprises $Al_{0.25}Ga_{0.75}As$ doped with said n-type dopant at a dopant concentration of $3\times10^{18}$ cm$^{-3}$.

37. The semiconductor field effect transistor as claimed in claim 35, wherein:

said potential barrier layer has a thickness of 1 nanometer;

said quantum well layer has a thickness of 5.5 nanometers; and said Schottky barrier layer has a thickness equal to or less than 1 nanometer.

38. The semiconductor field effect transistor as claimed in claim 36, wherein said carrier supplying layer has a thickness of 20 nanometers.

39. The semiconductor field effect transistor as claimed in claim 27, wherein said supper-lattice structure has three periods of said alternate potential barrier layers and quantum well layers.

* * * * *